US006756681B1

United States Patent
Hanawa

(10) Patent No.: US 6,756,681 B1
(45) Date of Patent: Jun. 29, 2004

(54) RADIO FREQUENCY INTEGRATED CIRCUIT HAVING INCREASED SUBSTRATE RESISTANCE ENABLING THREE DIMENSIONAL INTERCONNECTION WITH FEEDTHROUGHS

(75) Inventor: Takeshi Hanawa, Tokyo (JP)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/328,213

(22) Filed: Dec. 23, 2002

(51) Int. Cl.[7] ...................... H01L 23/482; H01L 23/532
(52) U.S. Cl. .................. 257/774; 257/723; 257/777
(58) Field of Search ................................ 257/684, 723, 257/774, 777

(56) References Cited

U.S. PATENT DOCUMENTS

| 5,063,177 | A | * | 11/1991 | Geller et al. | 438/107 |
|---|---|---|---|---|---|
| 5,882,997 | A | * | 3/1999 | Sur et al. | 438/600 |
| 6,185,107 | B1 | * | 2/2001 | Wen | 361/803 |
| 6,478,883 | B1 | | 11/2002 | Tamatsuka et al. | 149/33.2 |
| 6,489,217 | B1 | | 12/2002 | Kalnitsky et al. | 438/409 |
| 2003/0119308 | A1 | * | 6/2003 | Geefay et al. | 438/640 |

* cited by examiner

Primary Examiner—Allan R. Wilson
(74) Attorney, Agent, or Firm—Harrington & Smith, LLP

(57) ABSTRACT

This invention provides a method for forming a three dimensional integrated circuit stacked structure (5), as well as a stacked structure formed in accordance with the method. The method includes placing a first integrated (1) circuit atop a second integrated circuit (2), and electrically connecting the first and the second integrated circuits at connection points (20). At least some of the connection points correspond to electrically conductive through-hole structures (12) made through a silicon substrate (14) of the first integrated circuit. The first one of the integrated circuits contains circuitry operating at frequencies equal to or greater than about 1 GHz, and the silicon substrate has a resistivity of at least about 100 ohms-cm. The result is that the electrical performance is not degraded, as the RF signal insertion loss at the through-hole interconnections is significantly reduced. In one embodiment the first integrated circuit (1) contains RF circuitry and the second integrated circuit (2) contains baseband circuitry. In the preferred embodiment the first and the second integrated circuits form a part of a wireless communications device, such as a cellular telephone.

11 Claims, 3 Drawing Sheets

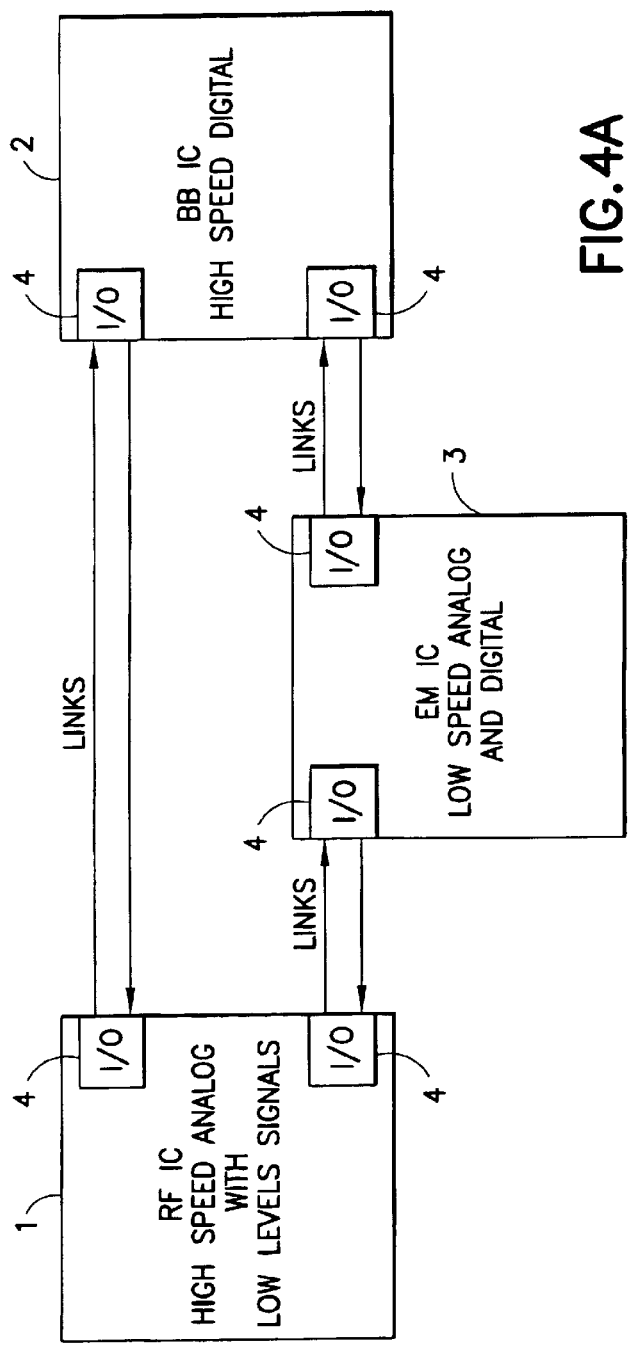
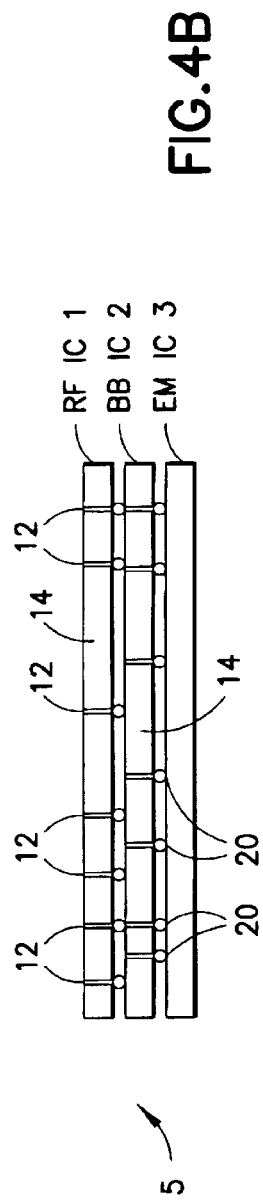
FIG.4A
FIG.4B

RADIO FREQUENCY INTEGRATED CIRCUIT HAVING INCREASED SUBSTRATE RESISTANCE ENABLING THREE DIMENSIONAL INTERCONNECTION WITH FEEDTHROUGHS

TECHNICAL FIELD

These teachings relate generally to integrated circuits (ICs) and, more specifically, relate to radio frequency (RF) ICs and to techniques for stacking ICs in three dimensional (3D) packaging arrangements.

BACKGROUND

In order to reduce the size of devices certain IC stacking structures have been developed. The stacking structures rely on a through-hole interconnection structure, also referred to in the art as a feedthrough or as a via, for making vertical connections between ICs that are stacked one upon another. In combination with the horizontal connections made within the ICs themselves, this technique provides a 3D IC packaging structure, thereby increasing the density and reducing the required package area. As compared with conventional wire-bond interconnections, the 3D packaging structure has a much greater potential for miniaturization.

A problem exists, however, when one of the ICs to be stacked is an IC that handles RF signals, such as those of about one GHz ($10^9$ Hertz) and greater, as the electrical performance is degraded due at least in part to insertion losses experienced by the RF signals at the through-hole interconnection structures. This problem relates to the fact that, in conventional 3D IC packaging approaches, the IC substrates (Si) typically have a resistivity of about 10 ohms-centimeter (10 ohms-cm) in order to enable the substrate to function as a ground. A result of the use of such low resistivity substrate material is that the substrate can appear as a capacitor to a high frequency signal, and can thereby deteriorate the signal.

At present, the application of through-hole interconnections in 3D IC structures is assumed for low-speed digital, or low frequency applications such as memory modules. Reference may be had to K. Kondo et al., "High Aspect Ratio Copper Via Fill used for Three Dimensional Chip Stacking", 2002 ICEP Proceedings, pp. 327, for a description of current state-of-the-art through-hole technology in the context of 3D IC stacking.

General reference with regard to a wafer stacking technique that can involve an RF circuit may be made to U.S. Pat. No. 6,489,217B1, Method of Forming an Integrated Circuit on a Low Loss Substrate, A. Kalnitsky et al., Dec. 3, 2002 (Maxim Integrated Products, Inc.), such as FIG. 9 and col. 4, lines 43–53. This patent discloses in part varying the dopant concentration of a silicon substrate or an epitaxial layer in order to increase the resistivity thereof to several thousand ohms-cm (col. 3, line 62 to col. 4, line 6).

SUMMARY OF THE PREFERRED EMBODIMENTS

The foregoing and other problems are overcome, and other advantages are realized, in accordance with the presently preferred embodiments of these teachings.

This invention provides for the use of the through-hole interconnection structure for not only low-speed and low frequency ICs, but also for RF and other high-speed application ICs. By the use of this invention an RF IC, or other type of high-speed IC, can be stacked with other types of ICs to thereby benefit from the advantages inherent in miniaturized devices, such as SiP (System in Package) solutions.

This invention provides a method for forming a three dimensional integrated circuit stacked structure, as well as a stacked structure formed in accordance with the method. The method includes placing a first integrated circuit atop a second integrated circuit, and electrically connecting the first and the second integrated circuits at connection points. At least some of the connection points correspond to electrically conductive through-hole structures made through a silicon substrate of the first integrated circuit. The first one of the integrated circuits contains circuitry operating at frequencies equal to or greater than about 1 GHz, and the silicon substrate has a resistivity of at least about 100 ohms-cm. The result is that the electrical performance is not degraded, as the RF signal insertion loss at the through-hole interconnection structures is significantly reduced.

In an exemplary embodiment the first integrated circuit contains RF circuitry and the second integrated circuit contains baseband circuitry. The second integrated circuit has a second silicon substrate that may also have a resistivity of at least about 100 ohms-cm. In the preferred embodiment the first and the second integrated circuits form a part of a wireless communications device, such as a cellular telephone.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 4A is a block diagram of a wireless communications device showing three exemplary functional units, i.e., an RF unit, a baseband (BB) unit and an energy management (EM) unit, each embodied in an IC; and FIG. 4B shows a 3D stacked IC arrangement corresponding to the wireless communications device shown in FIG. 4A.

DETAILED DESCRIPTION OF THE PREFERRED EMBODIMENTS

Figure 1:
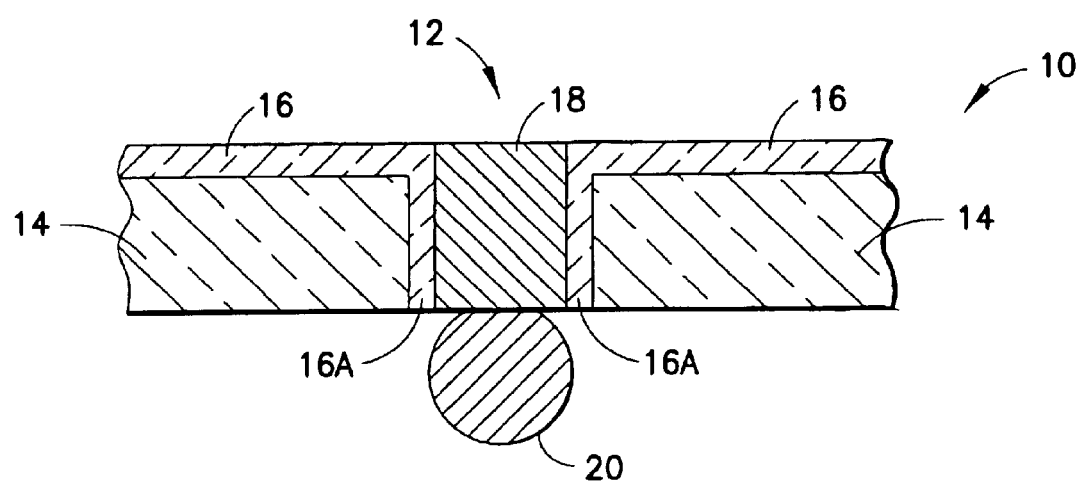
FIG. 1 is an enlarged, cross-sectional view of a silicon substrate that contains a through-hole structure.

FIG. 1 is an enlarged, cross-sectional view of an IC substrate 10 that contains a through-hole structure 12. The IC substrate 10 is assumed to contain or support RF or other high speed circuitry. The substrate 10 includes a silicon body 14 through which the through-hole structure 12 is made by any conventional process, such as masking and etching. In accordance with conventional practice there is at least one layer of dielectric material 16 overlying a surface of the substrate 10, such as a layer of native silicon dioxide ($SiO_2$). In other embodiments other types of oxides can be employed, as can layers of polymeric materials. In the preferred embodiment the dielectric material also forms an insulating sleeve 16A within the through-hole structure 12. Electrical conductivity is established from the top-side surface 10A to the bottom-side surface 10B of the substrate 10 by an electrically conductive material such as, but not limited to, metal 18, that fills the through-hole structure 12 within the sleeve 16A. The metal 18 may be copper, or aluminum, or any suitable low resistivity metal, or alloy, or multi-layered metal system. An electrically conductive contact 20, such as a solder ball, is formed on the exposed metal 18 at the bottom-side surface 10B of the substrate 10. The contact 20 may be used to form an electrical contact to a corresponding electrical contact, such as a planar pad, on another IC (not shown in FIG. 1) upon which the substrate 10 is stacked.

In accordance with this invention, the silicon body 14 is comprised of silicon having a resistivity of at least about 100 ohms-cm. As is well known in the art, the resistivity of a silicon substrate can be changed by changing the concentration of dopants. Reference in this regard can be made, as one example, to U.S. Pat. No. 6,478,883 B1, Silicon Single Crystal Wafer, Epitaxial Silicon Wafer, and Methods for Producing Them, M. Tamatsuka et al. Nov. 12, 2002, (Shin-Etsu Handotai Co., Ltd). This particular patent shows the use of boron-doped single crystal silicon having a resistivity of from 10–100 million ohms-cm, as well as antimony-doped and phosphorus-doped single crystal silicon wafers.

Figure 2:
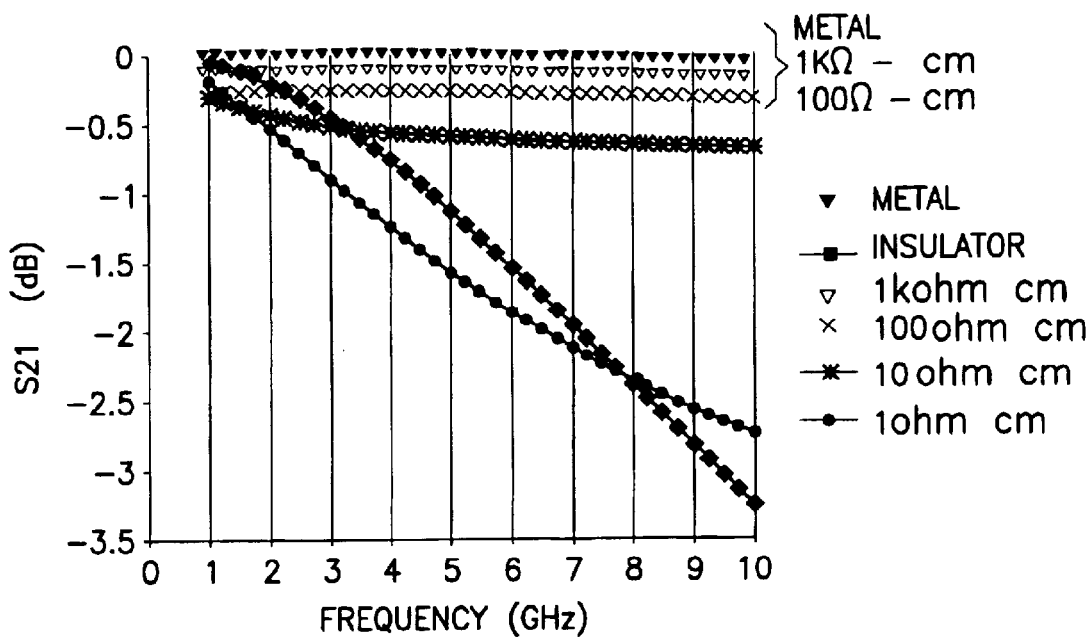
FIG. 2 is a chart showing insertion loss a function of frequency for substrates of different resistivities.
Figure 3:
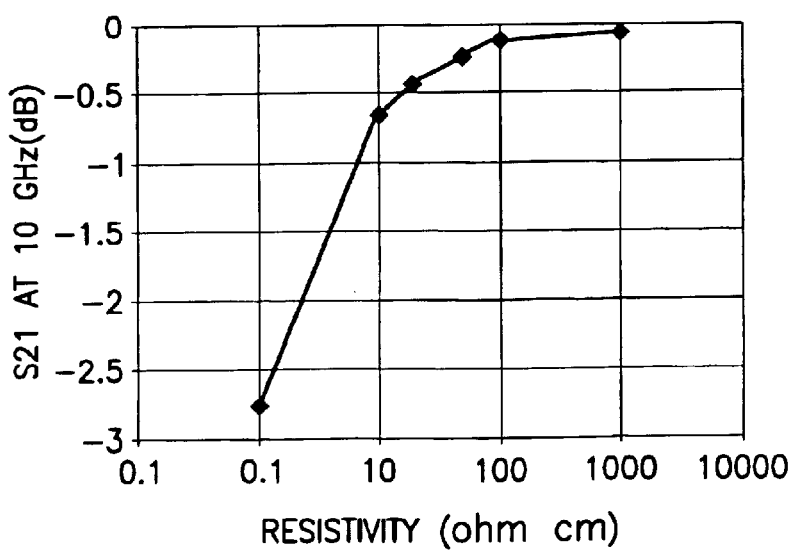
FIG. 3 is a chart that plots substrate resistivity versus insertion loss at 10 GHz.

Reference is made to the graphs of FIGS. 2 and 3 for showing simulation results of insertion loss of the through-hole interconnection structure 12, where the resistivity of the silicon body 14 portion of the substrate 10 is varied. In FIG. 2 "Metal" means that the silicon body 14 portion is assumed to be a perfect electrical conductor, and "Insulator" means that the silicon body 14 portion is assumed to have infinite resistivity. As is shown in FIGS. 2 and 3, if the resistivity of the silicon body 14 portion is about at least 100 ohm-cm, or larger, the insertion loss of the through-hole interconnection structure 12 is small, at least up to 10 GHz, and is thus suitable for use with current RF and other high speed ICs.

Exemplary and non-limiting dimensions and other parameters relating to the results shown in FIGS. 2 and 3 are as follows: thickness of the substrate (silicon body 14): 50 micrometers; diameter of the through-hole structure 12: 50 micrometers; thickness of the dielectric material (oxide) 16: 0.5 micrometers; and boron as the dopant for the Si substrate 14. In this non-limiting example a boron concentration of the $10^{15}$ atoms/cm$^3$ results in a substrate resistivity of 10 ohms-cm, while reducing the boron concentration to about $10^4$ atoms/cm$^3$ results in the desired substrate resistivity of about 100 ohms-cm.

FIG. 4A illustrates an example of a system containing several integrated circuits (ICs) 1, 2 and 3 with various signal types in a wireless communication terminal or device, such as a cellular telephone or a personal communicator. Signaling between the ICs 1, 2 and 3 may be conducted over links through I/O-cells 4 contained within each IC. In the illustrated example, IC 1 is an RF IC containing high speed analog circuitry with low level signals, such as RF amplifiers, RF mixers, and RF oscillators, IC 2 is baseband (BB) IC characterized by high speed digital signals and circuits, such as a digital signal processor (DSP), and IC 3 is an energy management (EM) device employing mixed low speed analog and digital circuitry.

FIG. 4B is an enlarged cross-sectional view showing a non-limiting example of a 3D stacked IC structure 5 corresponding to the wireless communications device shown in FIG. 4A. In this example the structure 5 has, from top to bottom, the RF IC 1, the BB IC 2 and the EM IC 3. Note that some of the through-hole structures 12 connect only the RF IC 1 to the BB IC 2, some of the through-hole structures 12 connect only the BB IC 2 to the EM IC 3, while some others of the through-hole structures 12 connect the RF IC 1 to the EM IC 3, via through-hole structures 12 that pass through the BB IC 2. After stacking the integrated circuits 1, 2 and 3 the solder balls 20 can be melted for providing electrical contacts between the ICs.

In accordance with this invention, the silicon body 14 of at least the RF IC 1 (and possible also the BB IC 2, depending on the clock frequencies used for the digital circuits) is comprised of silicon having a resistivity of at least about 100 ohms-cm. Note that it may be desirable to provide the at least 100 ohm-cm resistivity Si substrate, even if the BB IC 2 does not operate with high frequency signals, if the BB IC 2 is required to conduct high frequency signals between the RF IC 1 and another IC below the BB IC 2.

In any event, the use of the at least 100 ohm-cm resistivity substrate material results in the electrical performance not being degraded, as in the prior art low resistivity (e.g., 10 ohms-cm) silicon substrates used in stacked IC structures, as the RF signal insertion loss at the through-hole interconnections 12 is significantly reduced, as was shown above in FIGS. 2 and 3.

Furthermore, the use of the at least 100 ohm-cm resistivity substrate material is advantageous in that the use of (unnecessarily) higher resistivity substrates (e.g., at least several thousands of ohms-cm) can result in unstable electrical potentials and interference between ICs. In addition, unnecessarily higher resistivity substrates may be more costly. The use of the at least 100 ohm-cm resistivity substrate material is presently preferred, as is a substrate having a resistivity of less that about 1000 ohms-cm, or more preferably less than about 500 ohms-cm, or even more preferably less than about 250 ohms-cm.

While at first glance it might appear that the similar results may be obtained by using thicker layers of the dielectric material 16, in practice the growth of thick dielectric films is expensive and time consuming. Furthermore, a reliable process for growing a thick layer of dielectric on the edges of a sidewall, to form the insulating sleeve 16A, is not generally available. However, increasing the resistivity of the substrate 14 by varying the dopant concentration so as to reach the threshold resistivity of about 100 ohms-cm is a much more cost effective approach, and is currently preferred.

If grounding structures or layers are desired they can be provided using metallization, and contacted using the through-hole structures 12.

While described in the context of presently preferred embodiments thereof, those skilled in the art should appreciate that a number of modifications may be made thereto, and that all such modifications will fall within the scope of this invention.

What is claimed is:

1. An RF integrated circuit comprising a silicon body portion containing at least one electrically conductive through-hole structure for connecting signals to another integrated circuit when the RF integrated circuit is placed within a three dimensional stacked integrated circuit structure, said silicon body portion having a resistivity of at least about 100 ohms-cm to about 1000 ohms-cm.

2. An RF integrated circuit as in claim 1, where the signals have a frequency equal to or greater than about 1 GHz.

3. An RF integrated circuit as in claim 1, where the another integrated circuit is a baseband integrated circuit.

4. A three dimensional integrated circuit stacked structure, comprising at least two integrated circuits, where a first one of the integrated circuits comprises RF circuitry formed upon a silicon substrate containing at least one electrically conductive through-hole structure for connecting signals to a second integrated circuit of the stacked structure, said silicon substrate having a resistivity of at least about 100 ohms-cm to about 1000 ohms-cm.

5. A three dimensional integrated circuit stacked structure as in claim 4, where the signals have a frequency equal to or greater than about 1 GHz.

6. A three dimensional integrated circuit stacked structure as in claim 4, where the second integrated circuit is a baseband integrated circuit.

7. A three dimensional integrated circuit stacked structure comprising at least two integrated circuits, where a first one of the integrated circuits comprises RF circuitry formed upon a silicon substrate containing at least one electrically conductive through-hole structure for connecting signals to a second integrated circuit of the stacked structure, said silicon substrate having a resistivity of at least about 100 ohms-cm, where the second integrated circuit is a baseband integrated circuit comprising baseband circuitry formed upon a second silicon substrate containing at least one electrically conductive through-hole structure, said second silicon substrate having a resistivity of at least about 100 ohms-cm.

8. A three dimensional integrated circuit stacked structure as in claim 4, where the first and the second integrated circuits form a part of a wireless communications device.

9. An RF integrated circuit comprising a silicon body portion containing at least one electrically conductive through-hole structure for connecting signals to another integrated circuit when the RF integrated circuit is placed within a three dimensional stacked integrated circuit structure, said silicon body portion having a resistivity in a range of about 100 ohms-cm to about 500 ohms-cm.

10. An RF integrated circuit comprising a silicon body portion containing at least one electrically conductive through-hole structure for connecting signals to another integrated circuit when the RF integrated circuit is placed within a three dimensional stacked integrated circuit structure, said silicon body portion having a resistivity in a range of about 100 ohms-cm to about 250 ohms-cm.

11. A three dimensional integrated circuit stacked structure, comprising at least two integrated circuits, where a first one of the integrated circuits comprises RF circuitry formed upon a silicon substrate containing at least one electrically conductive through-hole structure for connecting signals to a second integrated circuit of the stacked structure, said silicon substrate having a resistivity in a range from about 100 ohms-cm to less than about 1000 ohms-cm, where the second integrated circuit comprises baseband circuitry formed upon a second silicon substrate containing at least one electrically conductive through-hole structure, said second silicon substrate having a resistivity in the range from about 100 ohms-cm to less than about 1000 ohm-cm.

* * * * *